US012642085B2

(12) United States Patent
Ogino et al.

(10) Patent No.: US 12,642,085 B2
(45) Date of Patent: May 26, 2026

(54) METAL INSULATOR METAL CAPACITOR (MIM CAPACITOR)

(71) Applicant: INTERNATIONAL BUSINESS MACHINES CORPORATION, Armonk, NY (US)

(72) Inventors: Atsushi Ogino, Fishkill, NY (US); Baozhen Li, South Burlington, VT (US); Dureseti Chidambarrao, Weston, CT (US); Matthew Stephen Angyal, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 407 days.

(21) Appl. No.: 18/451,141

(22) Filed: Aug. 17, 2023

(65) Prior Publication Data

US 2025/0062219 A1     Feb. 20, 2025

(51) Int. Cl.
| | |
|---|---|
| *H10W 20/40* | (2026.01) |
| *H10D 1/68* | (2025.01) |
| *H10W 20/00* | (2026.01) |
| *H10W 20/42* | (2026.01) |

(52) U.S. Cl.
CPC .......... *H10W 20/496* (2026.01); *H10D 1/692* (2025.01); *H10W 20/056* (2026.01); *H10W 20/42* (2026.01)

(58) Field of Classification Search
CPC ... H01L 23/5223; H01L 23/5226; H10D 1/60; H10D 1/692–696; H10D 1/716; H10W 20/056; H10W 20/42; H10W 20/496
See application file for complete search history.

(56) References Cited

U.S. PATENT DOCUMENTS

| | | | |
|---|---|---|---|
| 9,391,016 B2 | 7/2016 | Shen | |
| 9,627,312 B2 | 4/2017 | Childs | |
| 10,103,218 B1 * | 10/2018 | Leobandung | ....... H01L 23/5226 |
| 10,211,147 B2 | 2/2019 | Zhang | |
| 10,580,581 B2 * | 3/2020 | Fox, III | ................ H01G 4/005 |
| 10,734,473 B2 | 8/2020 | Cheng | |
| 10,734,475 B2 | 8/2020 | Ando | |
| 11,056,556 B2 | 7/2021 | Shen | |
| 11,437,331 B2 | 9/2022 | Huang | |
| 11,688,759 B2 * | 6/2023 | Shen | ...................... H10D 1/692 |
| | | | 257/296 |
| 2005/0260847 A1 | 11/2005 | Yang | |

(Continued)

*Primary Examiner* — Jeff W Natalini
*Assistant Examiner* — Katrina Waljeski-Moses
(74) *Attorney, Agent, or Firm* — Robert R. Aragona

(57) ABSTRACT

A semiconductor device including a metal insulator metal capacitor (MIM capacitor), a first via connected to and through a bottom plate of the MIM, and a middle plate of the MIM, where a middle isolated portion of the middle plate of the MIM surrounds the first via. A MIM capacitor, a first via connected to and through a bottom plate of the MIM, and a middle plate of the MIM, where a middle isolated portion of the middle plate of the MIM surrounds the first via, where the middle isolated portion is surrounded by a middle isolation dielectric on all vertical side surfaces. Forming a MIM capacitor, forming a first via connected to and through a bottom plate of the MIM, and forming a middle plate of the MIM, where a middle isolated portion of the middle plate of the MIM surrounds the first via.

20 Claims, 16 Drawing Sheets

Section X1-X1

(56)  References Cited

U.S. PATENT DOCUMENTS

| | | | |
|---|---|---|---|
| 2020/0227348 A1* | 7/2020 | Lin | H10D 1/692 |
| 2022/0140070 A1 | 5/2022 | Hakamo | |
| 2023/0025412 A1 | 1/2023 | Chiu | |
| 2023/0352396 A1* | 11/2023 | Hsiao | H01G 4/385 |
| 2025/0062218 A1 | 2/2025 | Ogino et al. | |
| 2025/0072017 A1 | 2/2025 | Ogino et al. | |

* cited by examiner

Section X1-X1

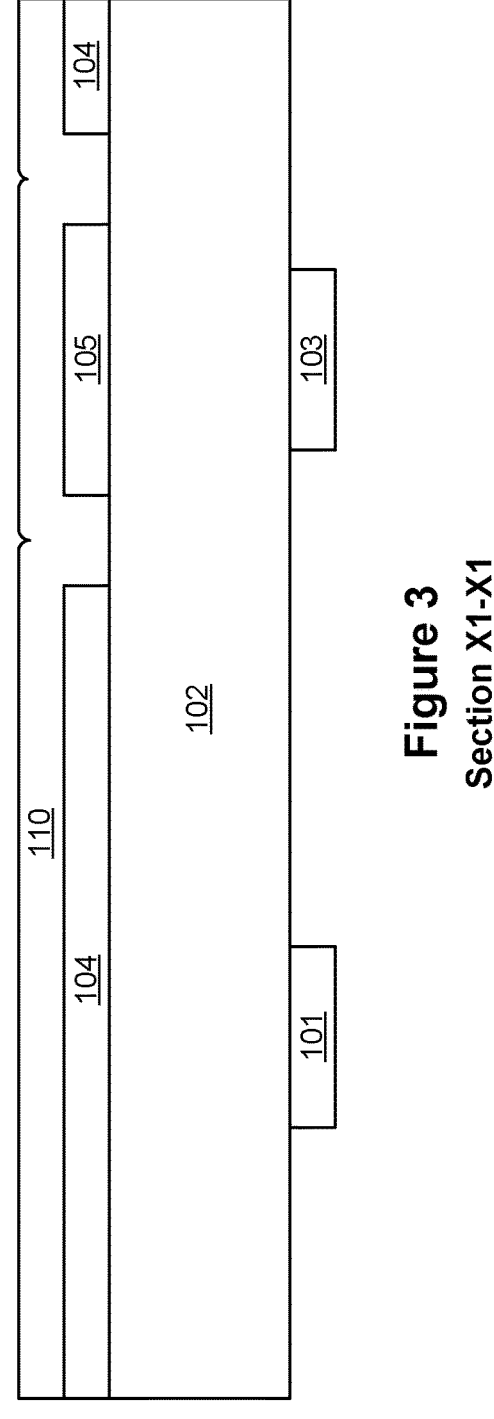
Figure 3
Section X1-X1
100

Section X1-X1

Section X1-X1

100

Section X1-X1

Section X1-X1

100

Section X1-X1

Section X1-X1

Section X1-X1

Section X1-X1

Section X1-X1

Section X1-X1

Section X1-X1

METAL INSULATOR METAL CAPACITOR (MIM CAPACITOR)

BACKGROUND

The present invention relates, generally, to the field of semiconductor manufacturing, and more particularly to a metal insulator metal (MIM) capacitor.

MIM capacitors are a key element for integration of system-on-chips, improving both circuit performance and down-scaling capability. A typical MIM capacitor includes an outer electrode, a dielectric/insulator layer and an inner electrode. Voltage is applied across the electrodes which results in charge storage within the formed capacitor configuration. MIM capacitors are used in functional circuits such as mixed signal circuits, analog circuits, radio frequency (RF) circuits, dynamic random access memory (DRAM), embedded DRAM, and logic operation circuits. In general, for a MIM capacitor in an RF application, a dielectric loss must be extremely small, and a series resistance of the wiring should be minimized for high frequency applications. This indicates that it is desirable to use short interconnect wires with a low specific resistance. A MIM capacitor integrated in back end of line (BEOL) metallization is suitable to fulfill these requirements.

SUMMARY

According to an embodiment of the present invention, a semiconductor device is provided. The semiconductor device including a metal insulator metal capacitor (MIM capacitor) within back end of line circuitry of the semiconductor device, a first via connected to and through a bottom plate of the MIM, and a middle plate of the MIM, where a middle isolated portion of the middle plate of the MIM surrounds the first via.

According to an embodiment of the present invention, a semiconductor device is provided. The semiconductor device including a metal insulator metal capacitor (MIM capacitor) within back end of line circuitry of the semiconductor device, a first via connected to and through a bottom plate of the MIM, and a middle plate of the MIM, where a middle isolated portion of the middle plate of the MIM surrounds the first via, where the middle isolated portion is surrounded by a middle isolation dielectric on all vertical side surfaces.

According to an embodiment of the present invention, a method is provided. The method including forming a metal insulator metal capacitor (MIM capacitor) within back end of line circuitry of the semiconductor device, forming a first via connected to and through a bottom plate of the MIM, and forming a middle plate of the MIM, where a middle isolated portion of the middle plate of the MIM surrounds the first via.

BRIEF DESCRIPTION OF THE DRAWINGS

The following detailed description, given by way of example and not intended to limit the invention solely thereto, will best be appreciated in conjunction with the accompanying drawings, in which:

FIG. 3 illustrates a cross-sectional view of the semiconductor structure along section line X1-X1 and illustrates formation of an inter-layer dielectric, according to an exemplary embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
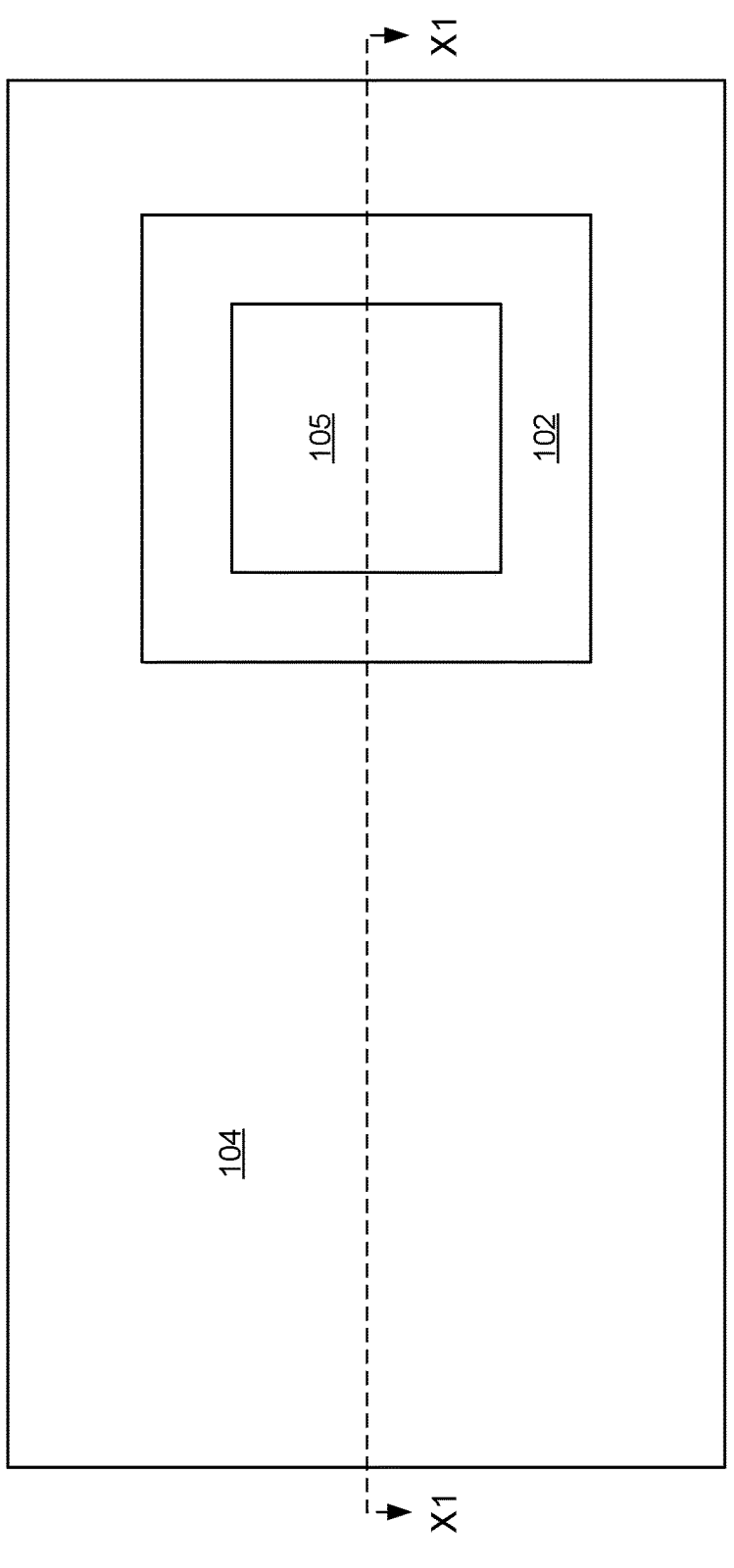
FIG. 1 illustrates a top view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates, generally, to the field of semiconductor manufacturing, and more particularly to a metal-insulator-metal (MIM) capacitor.

There is a high demand for on chip capacitors, such as MIM capacitors, in high performance chip designs. Advanced technologies usually offer two types of back end of line (BEOL) capacitors, a plane high capacitance density MIM capacitor at higher metal, and metal finger arrays which provides a low capacitance density. A plane high capacitance density MIM capacitor has planar metal plates with a high-k dielectric thin film (such as HfO2, Al2O3, ZrO2, Ta2O5, or a combination) sandwiched between the planar metal plates. The plane high capacitance density MIM capacitor is built between two different metal wire levels. A metal finger array MIM capacitors include an array of parallel metal lines from the same metal wire level. These parallel metal lines serve as electrodes, and the inter-line dielectric (ILD) (usually a low k or a silicon-based oxide) between the metal lines serves as insulator layer for the capacitor. For some high performance devices, e.g. SRAM, there is a need for "local" decoupling capacitors to boost performance and yield. Metal finger array MIM capacitors have a capacitance density which is too low, and would need a large area of the chip to increase the capacitance. A local capacitor, near electronic components of the chip is preferred, such as a MIM capacitor.

A MIM capacitor may include an outer plate and an inner plate or electrode, with an insulator between the outer plate and the inner plate. The outer plate and the inner plate each may be referred to as a metal layer and alternatively each may be referred to as an electrode. There may be a first contact and a first via connected to the outer plate and a second via and a second contact may be connected to the inner plate. The first via and the second via may each connect between Mx metal lines, for example between Mx-1 metal line and Mx metal line. A MIM capacitor may have two or more plates. For example, there may be two outer plates surrounding an inner plate. There may be two outer plates alternating layers with two inner plates.

Following is a traditional embodiment of a three layer MIM capacitor. A bottom metal layer of an outer plate may be formed. A portion of the bottom metal layer may be removed, creating a first opening, or a first window. The first window may be referred to as a first contact slot. The first opening may have a square, rectangular, circular, oval, or other polygon shape from a top view. A first dielectric layer may be conformally formed on the bottom metal layer and in the first opening. In an embodiment, the first dielectric may be part of the insulator layer of the MIM capacitor. A middle metal layer may be conformally formed on the first dielectric layer. The middle metal layer may be an inner plate of the MIM capacitor. A portion of the middle metal layer may be removed, creating a second opening, or a second window. The second opening may have a square or a rectangular shape from a top view. The second opening may be referred to as a second contact slot. A second dielectric layer, or a second insulator layer, may be conformally formed on the middle metal layer and in the second opening. The second dielectric layer may be part of the insulator layer of the MIM capacitor. A top metal layer may be formed. A portion of the top metal layer may be removed, creating a third opening, or a third window. The third opening may have a square or a rectangular shape from a top view. The third opening may be vertically aligned above the first opening.

A first via may be formed through the bottom metal layer and the top metal layer, forming a first contact to the outer plate, where the outer plate is the bottom metal layer and the top metal layer. The first via may be formed in a first contact opening where the first opening and the third opening are vertically aligned. The first dielectric separates the bottom metal layer from the middle metal layer. The second dielectric separates the middle metal layer from the top metal layer. A second via may be formed through the middle metal layer, forming a second contact to the inner plate, where the inner plate is the middle metal layer. The second via may be formed in a second contact opening where the second opening is.

There are reliability concerns with the current method of formation of a MIM capacitor. Portions of the bottom metal layer are removed for the second contact opening. The first insulator and the middle metal layer are formed, they are conformally formed over the second contact opening. This results in the first insulator and the middle metal layer being formed with "steps", or surfaces which have more than one level, with differing heights from an upper surface of a substrate which the MIM capacitor is formed on. The first insulator and the middle metal layer each have more than one lower horizontal surface and more than one upper horizontal surface. The steps, or edges, where the surfaces change heights are reliability concerns. Similarly, portions of the middle metal layer are removed for the first contact opening. The second insulator and the top metal layer are conformally formed over the first contact opening. This results in the second insulator and the middle metal layer being formed with "steps", or surfaces which have more than one level, with differing heights from an upper surface of a substrate which the MIM capacitor is formed on. The second insulator and the middle metal layer each have more than one lower horizontal surface and more than one upper horizontal surface. The steps, or edges, where the surfaces change heights are reliability concerns.

Reliability concerns include electromigration failure and time-zero short/time dependent dielectric breakdown (hereinafter "TDDB") failure. Formation of the MIM capacitor with traditional methods of formation may have non-conformal electrode metal and insulators, which can lead to electrode pinch-off, resulting in electromigration failure and insulator pinch-off, which can cause a time-zero short/ TBBD failure.

Non-conformal electrode metal and insulators, which means the metal layers and the insulators have a systematic thickness or property weakness spot or significant variation at specific location. Electrode pinch-off means the metal layer thickness is significantly thinner at certain location results in discontinuous metal layers. This can lead to electromigration failure due to insufficient conductive area for electron flow.

Insulator pinch-off means an insulator layer thickness is significantly thinner at certain location results in metal layers shorting. This can lead to time-zero short, which means two or more than two conductive metals in different electrical polarities are connected. This can also lead to TBBD failure due to insufficient isolation of two or more than two conductive metals with different electrical polarities.

In this invention, the MIM capacitor may be formed which will eliminate formation of the bottom metal layer, the middle metal layer, the top metal layer, the first insulator and the second insulator each with "steps" within the layer, where there is more than one level of material. This will reduce MIM capacitor electrode and high-k coverage weakness and also improve MIM capacitor electromigration, TDDB, Vmax and time-zero short, all of which are significantly valuable for improved performance.

Vmax is a maximum voltage can be applied in a system while meeting a requirement usage, a requirement usage such as a size of a circuit and a duration of ten years. A Vmax is projected during TDDB reliability stressing. An improved TDDB reliability will result in an improved Vmax, which is a higher Vmax.

With the advanced MIM capacitor designs, such as a greater than two plate MIM capacitor and a thinner high-k insulator layer, metal step control becomes more important to achieve reliability requirements. Current embodiments are based on a three plate MIM capacitor, which is three metal layers and two insulator films between each metal layer. For increasing a capacitance of the MIM capacitor, there is a trend to increasing a number of layers of the MIM capacitor, with more metal layers and more layers of insulator film between each metal layer. The thinner high-k insulator film thickness occurs at corners of the metal layers.

In this invention, a bottom metal layer of an outer plate may be formed. A portion of the bottom metal layer may be removed, creating a first opening, or a first window. The first window may be referred to as a first contact slot. The first opening may have an outline of a square, a rectangle, a circle, an oval, or other polygon shape, from a top view. A remaining portion of the bottom metal layer may remain within the first window and may be referred to as a first isolated portion. The first isolated portion of the bottom metal layer may be a similar shape as the first opening outline, or may have a different shape. A first dielectric isolation, or a first insulator layer may be conformally formed on the bottom metal layer and in the first opening. In an embodiment, the first dielectric isolation may be part of the insulator layer of the MIM capacitor. The first dielectric isolation may physically and electrically isolate the first isolated portion of the bottom metal layer from a remainder of the bottom metal layer.

A middle metal layer may be conformally formed on the first dielectric layer. The middle metal layer may be an inner plate of the MIM capacitor. A portion of the middle metal layer may be removed, creating a second opening, or a second window. The second opening may have an outline of a square, a rectangle, a circle, an oval, or other polygon shape, from a top view. The second opening may be referred to as a second contact slot. A remaining portion of the middle metal layer may remain within the second window and may be referred to as a second isolated portion. The second isolated portion of the middle metal layer may be a similar shape as the first opening outline, or may have a different shape. A second dielectric isolation, or a second insulator layer, may be conformally formed on the middle metal layer and in the second opening. The second dielectric isolation may be part of the insulator layer of the MIM capacitor. The second dielectric isolation may physically and electrically isolate the second isolated portion of the middle metal layer from a remainder of the middle metal layer.

A top metal layer may be formed. A portion of the top metal layer may be removed, creating a third opening, or a third window. The top opening may have an outline of a square, a rectangle, a circle, an oval, or other polygon shape from a top view. The third opening may be vertically aligned above the first opening. A remaining portion of the top metal layer may remain within the third window and may be referred to as a third isolated portion. The third isolated portion of the third metal layer may be a similar shape as the third opening outline, or may have a different shape. A third dielectric layer may be conformally formed on the top metal layer and in the third opening. The third dielectric layer may physically and electrically isolate the third isolated portion of the top metal layer from a remainder of the top metal layer.

A first via may be formed through the bottom metal layer and the top metal layer, forming a first contact to the outer plate, where the outer plate is the bottom metal layer and the top metal layer. The first via may be formed in a first contact opening where the first opening and the third opening are vertically aligned. The first via may be formed through the portion of the second isolated portion.

A second via may be formed through the middle metal layer, forming a second contact to the inner plate, where the inner plate is the middle metal layer. The second via may be formed in a second contact opening where the second opening is. The second via may be formed through the first isolated portion and through the third isolated portion.

This invention may be applied to any number of layers of metal plates and insulators between the metal plates.

This invention provides layers which do not have steps, or surfaces with more than one level. All layers of the metal plates and layers of the insulators between the metal plates have a coplanar upper horizontal surface and a coplanar lower horizontal surface. Specifically, the bottom metal layer has a coplanar upper horizontal surface and a coplanar lower horizontal surface, and there is only one upper horizontal surface and only one lower horizontal surface. The middle metal layer has a coplanar upper horizontal surface and a coplanar lower horizontal surface, and there is only one upper horizontal surface and only one lower horizontal surface. The top metal layer has a coplanar upper horizontal surface and a coplanar lower horizontal surface, and there is only one upper horizontal surface and only one lower horizontal surface. The first insulator and the second insulator each have one continuous planar upper horizontal surface and one continuous coplanar lower horizontal surface, and there is only one upper horizontal surface and only one lower horizontal surface.

This invention provides a MIM capacitor with improved reliability due to metal layers and insulators with a single upper horizonal surface and a single lower horizonal surface.

The present invention relates, generally, to the field of semiconductor manufacturing, and more particularly to a metal-insulator-metal (MIM) capacitor.

Figure 2:
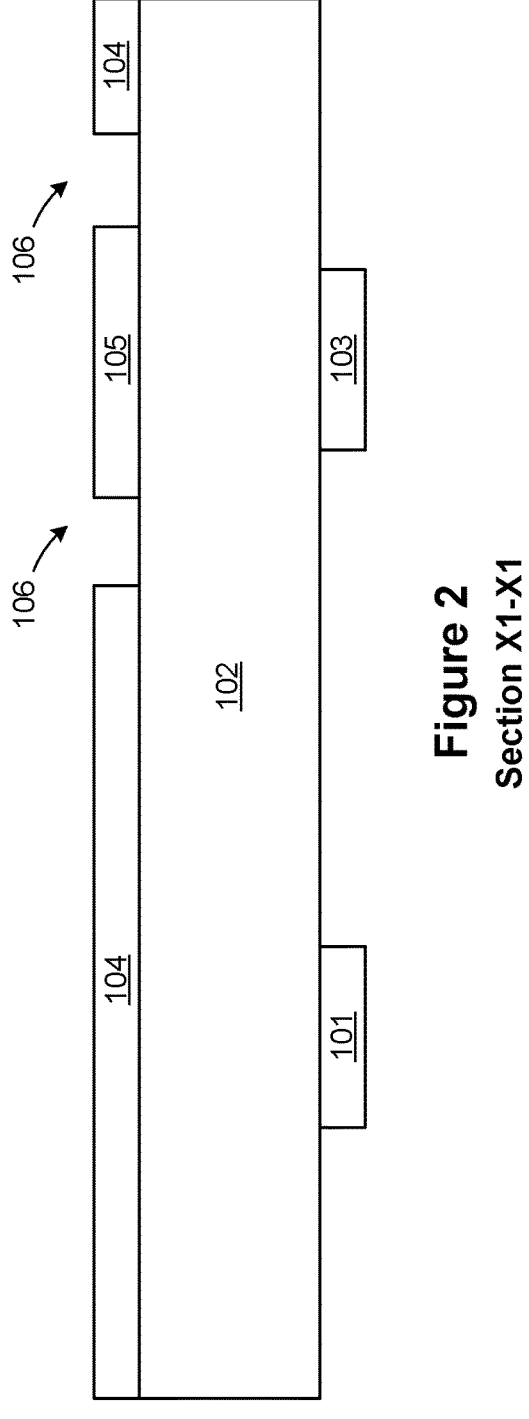
FIG. 2 illustrates a cross-sectional view of the semiconductor structure according to FIG. 1, along section line X1-X1, according to an exemplary embodiment.
Figure 2:

Referring now to FIGS. 1 and 2, a semiconductor structure 100 (hereinafter "structure") at an intermediate stage of fabrication is shown according to an exemplary embodiment. FIG. 1 is a top view of the structure 100. FIG. 2 is a cross-sectional view of the structure 100 along section line X1-X1. The structure 100 may be formed or provided. The structure 100 may include an Mx-1 metal line 101, an Mx-1 metal line 103, an inter-layer dielectric (hereinafter "ILD") 102, a bottom plate 104 and an isolated portion 105.

The structure 100 may include several back end of line ("BEOL") layers. In general, the back end of line (BEOL) is where individual devices (transistors, capacitors, resistors, etc.) are interconnected with wiring on a semiconductor wafer.

The Mx-1 metal line 101 and the Mx-1 metal line 103 may each be composed of, for example, tantalum nitride (TaN), tantalum (Ta), titanium (Ti), titanium nitride (TiN), cobalt (Co) or a combination thereof. There may be any number of Mx-1 metal lines 101 and Mx-1 metal lines 103, on the structure 100. The Mx-1 metal line 101 and the Mx-1 metal line 103 may be formed by methods known in the arts.

The ILD 102 may be formed by depositing or growing a dielectric material on the BEOL layers, followed by a chemical mechanical polishing (CMP) or etch steps. The ILD 102 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the ILD 102 may include one or more layers. In an embodiment, the ILD 102 may include any dielectric material such as tetraethyl orthosilicate (TEOS), silicon oxide (SiOx), silicon nitride (SiNx), silicon boron carbonitride (SiBCN), NBLoK, a low-k dielectric material (with k<4.0) such as SiCOH, SiCNH and SiCNOH, including but not limited to, silicon oxide, spin-on-glass, a flowable oxide, a high-density plasma oxide, borophosphosilicate glass (BPSG), or any combination thereof or any other suitable dielectric material. NBLoK is a trademark of Applied Materials, Inc.

The bottom plate 104 may be formed from a conductive material layer which is blanket deposited on top of the structure 100, and directly on an upper horizontal surface of the ILD 102. The conductive material layer may include materials such as, for example titanium nitride (TiN), tantalum nitride (TaN). The conductive material can be formed by for example, chemical vapor deposition (CVD), physical vapor deposition (PVD), and atomic layer deposition (ALD) or a combination thereof.

An opening 106 may be formed by removal of portions of the bottom plate 104, exposing an upper horizontal surface of the ILD 102, by selective etching, such as reactive etching (RIE). In an embodiment, the opening 106 may have a rectangular shaped outline when viewed from the top view of FIG. 1. There may be a rectangular shaped portion of the bottom plate 104 within the rectangular shaped outline of the opening 106 which may be referred to as the isolated portion 105. In an alternate embodiment, the opening 106 may have a circular outline, an oval outline or a polygonal outline, with the isolated portion 105 within the outline.

The opening 106 may be vertically aligned above the Mx-1 metal line 103.

Referring now to FIG. 3, the structure 100 is shown according to an exemplary embodiment. FIG. 3 is a cross-sectional view of the structure 100 along section line X1-X1. An isolation dielectric 110 may be formed.

The isolation dielectric 110 may be conformally deposited on the structure 100. The isolation dielectric 110 may be formed as described for the ILD 102. The isolation dielectric 110 may be formed on the bottom plate 104, the isolated portion 105 and on the ILD 102, and fill the opening 106. The isolation dielectric 110 isolates the isolated portion 105 from the bottom plate 104.

Figure 4:
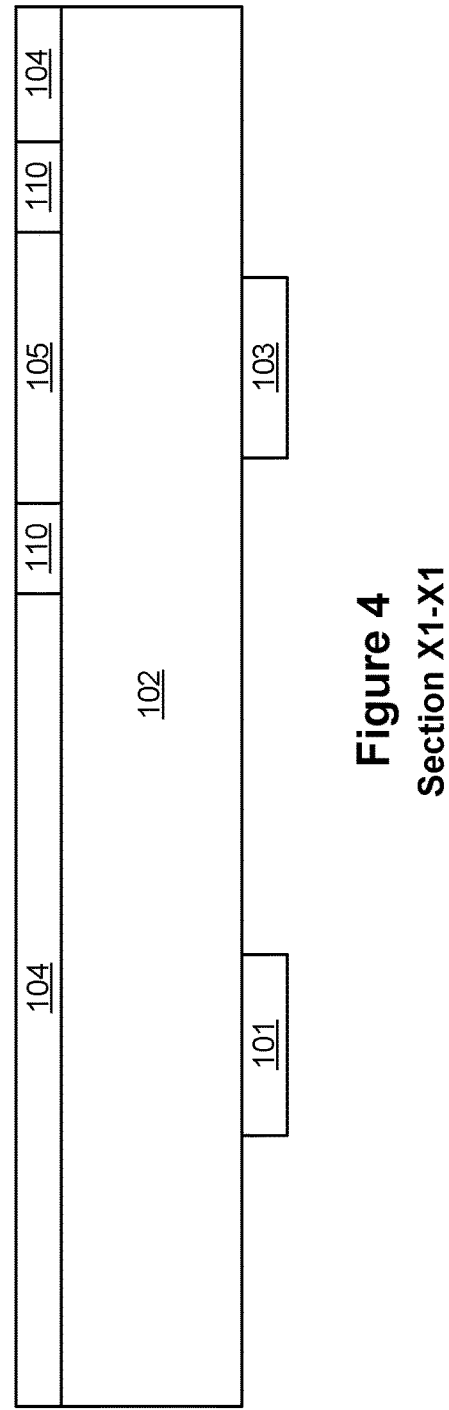
FIG. 4 illustrates a cross-sectional view of the semiconductor structure along section line X1-X1 and illustrates removal of portions of the inter-layer dielectric, according to an exemplary embodiment.
Figure 4:

Referring now to FIG. 4, the structure 100 is shown according to an exemplary embodiment. FIG. 4 is a cross-sectional view of the structure 100 along section line X1-X1. Portions of the isolation dielectric 110 may be removed.

A planarization process, such as, for example, chemical mechanical polishing (CMP), may be done to remove excess material from an upper horizontal surface of the structure 100 such that upper horizontal surfaces of the bottom plate 104, the isolated portion 105 and the isolation dielectric 110 are coplanar. Remaining portions of the isolation dielectric 110 may fill the opening 106 and isolate the isolated portion 105 from the bottom plate 104.

Figure 5:
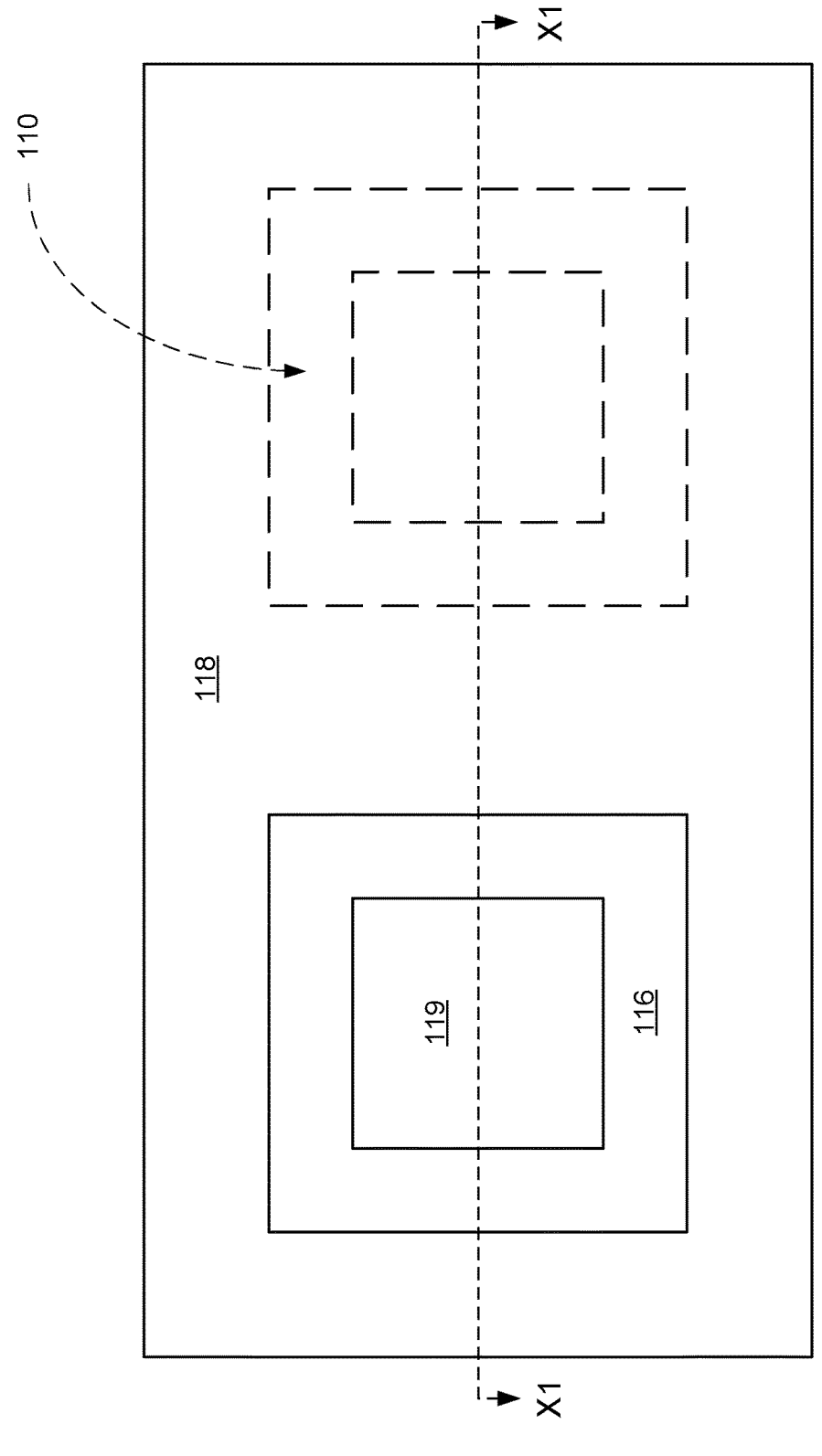
FIG. 5 illustrates a top view of the semiconductor structure, and illustrations formation of an insulator and an middle plate, according to an exemplary embodiment.
Figure 6:
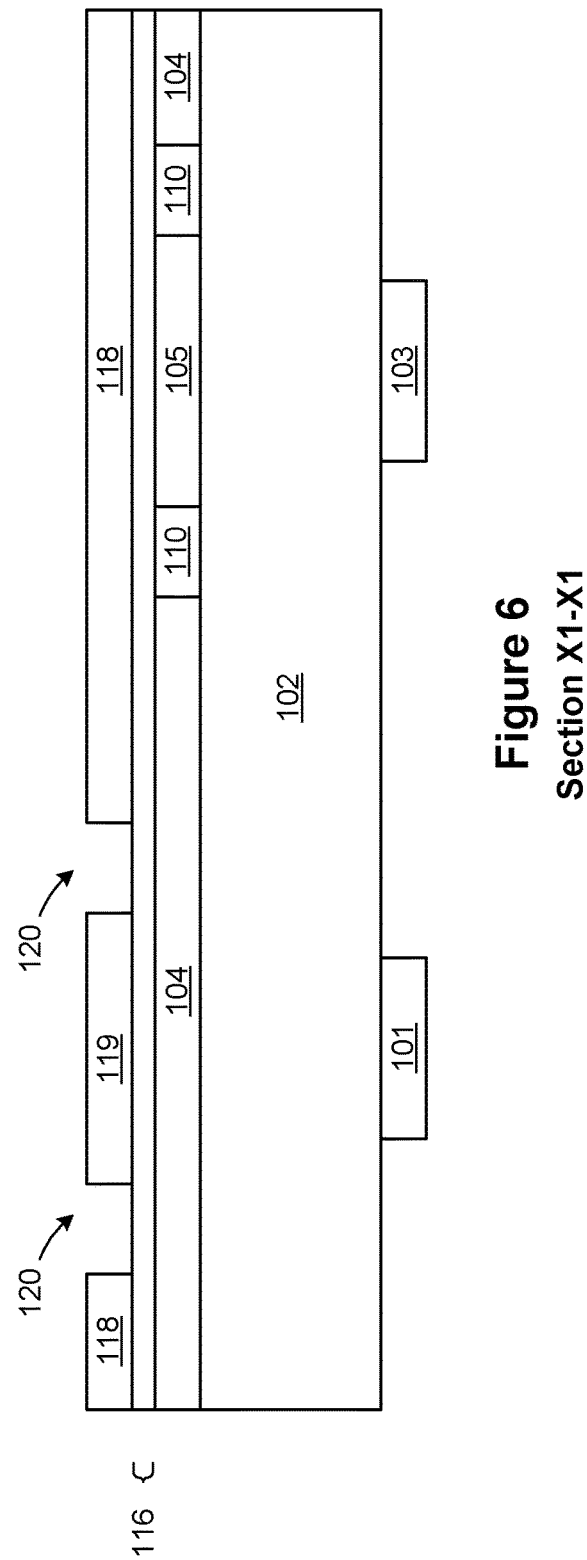
FIG. 6 illustrates a cross-sectional view of the semiconductor structure according to FIG. 5, along section line X1-X1, according to an exemplary embodiment.

Referring now to FIGS. 5 and 6, the structure 100 is shown according to an exemplary embodiment. FIG. 5 is a top view of the structure 100. FIG. 6 is a cross-sectional view of the structure 100 along section line X1-X1. An insulator 116 may be formed. An middle plate 118 and an isolated portion 119 may be formed.

The dashed lines of the isolation dielectric 110 indicate this structure is below an upper surface of the top view of the structure 100 shown in FIG. 5.

The insulator 116 may be deposited on an upper surface of bottom plate 104, the isolated portion 105 and the isolation dielectric 110. The insulator 116 may be deposited using typical deposition techniques, for example, atomic layer deposition (ALD), molecular layer deposition (MLD), chemical vapor deposition (CVD), physical vapor deposition (PVD), high density plasma (HDP) deposition. In an embodiment, the insulator 116 may include any high-k dielectric and may include, but is not limited to $HfO_2$, $ZrO_2$, $La_2O_5$, $Al_2O_3$, $TiO_2$, a high-k dielectric material (with k>4.0), or a combination thereof.

The middle plate 118 may be formed from a conductive material layer which is blanket deposited on top of the structure 100, and directly on an upper horizontal surface of the insulator 116. The conductive material layer may include materials such as, for example titanium nitride (TiN), tantalum nitride (TaN), copper (Cu), ruthenium (Ru), cobalt (Co), tungsten (W). The conductive material can be formed by for example, chemical vapor deposition (CVD), physical vapor deposition (PVD), and atomic layer deposition (ALD) or a combination thereof.

An opening 120 may be formed by removal of portions of the middle plate 118, exposing an upper horizontal surface of the insulator 116, by selective etching, such as reactive etching (RIE). In an embodiment, the opening 120 may have a rectangular shaped outline when viewed from the top view of FIG. 5. There may be a rectangular shaped portion 119 of the middle plate 118, which is within the rectangular shaped outline of the opening 120. In an alternate embodiment, the opening 120 may have circular outline, an oval outline or a polygonal outline, with the isolated portion 119 within each outline.

The opening 120 may be vertically aligned above the Mx-1 metal line 101.

Figure 7:
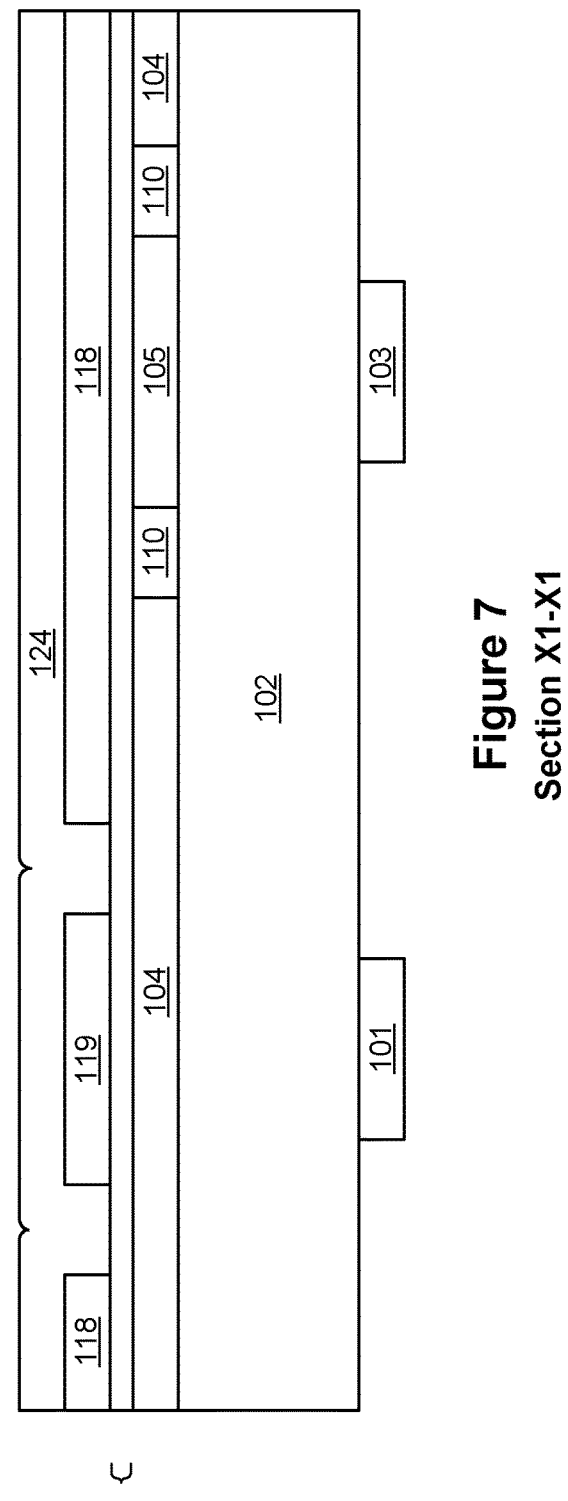
FIG. 7 illustrates a cross-sectional view of the semiconductor structure along section line X1-X1 and illustrates formation of a second inter-layer dielectric, according to an exemplary embodiment.

Referring now to FIG. 7, the structure 100 is shown according to an exemplary embodiment. FIG. 7 is a cross-sectional view of the structure 100 along section line X1-X1. An isolation dielectric 124 may be formed.

The isolation dielectric 124 may be conformally deposited on the structure 100. The isolation dielectric 124 may be formed as described for the ILD 102. The isolation dielectric 124 may be formed on the middle plate 118, the isolated portion 119 and on the insulator 116, and fill the opening 120. The isolation dielectric 124 isolates the isolated portion 119 from the middle plate 118.

Figure 8:
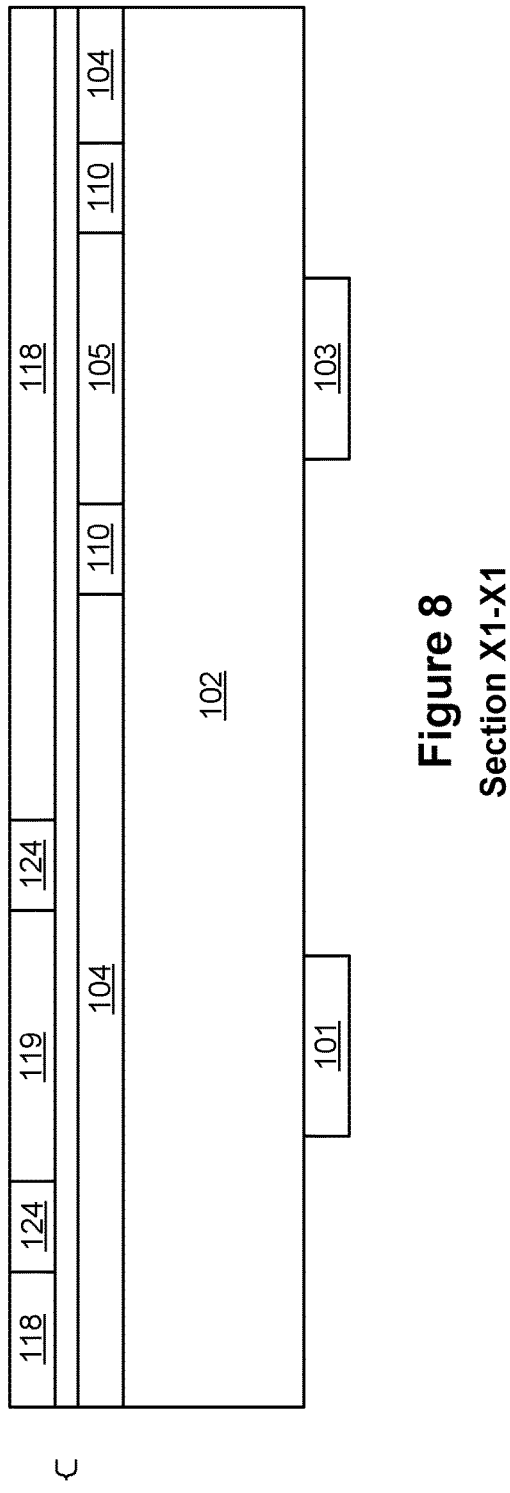
FIG. 8 illustrates a cross-sectional view of the semiconductor structure along section line X1-X1, and illustrates removal of portions of the second inter-layer dielectric, according to an exemplary embodiment.

Referring now to FIG. 8, the structure 100 is shown according to an exemplary embodiment. FIG. 8 is a cross-sectional view of the structure 100 along section line X1-X1. Portions of the isolation dielectric 124 may be removed.

A planarization process, such as, for example, chemical mechanical polishing (CMP), may be done to remove excess material from an upper horizontal surface of the structure 100 such that upper horizontal surfaces of the isolation dielectric 124, the isolated portion 119 and the middle plate 118 are coplanar. Remaining portion of the isolation dielectric 124 may fill the opening 120. The isolation dielectric 124 isolates the isolated portion 119 from the middle plate 118.

Figure 9:
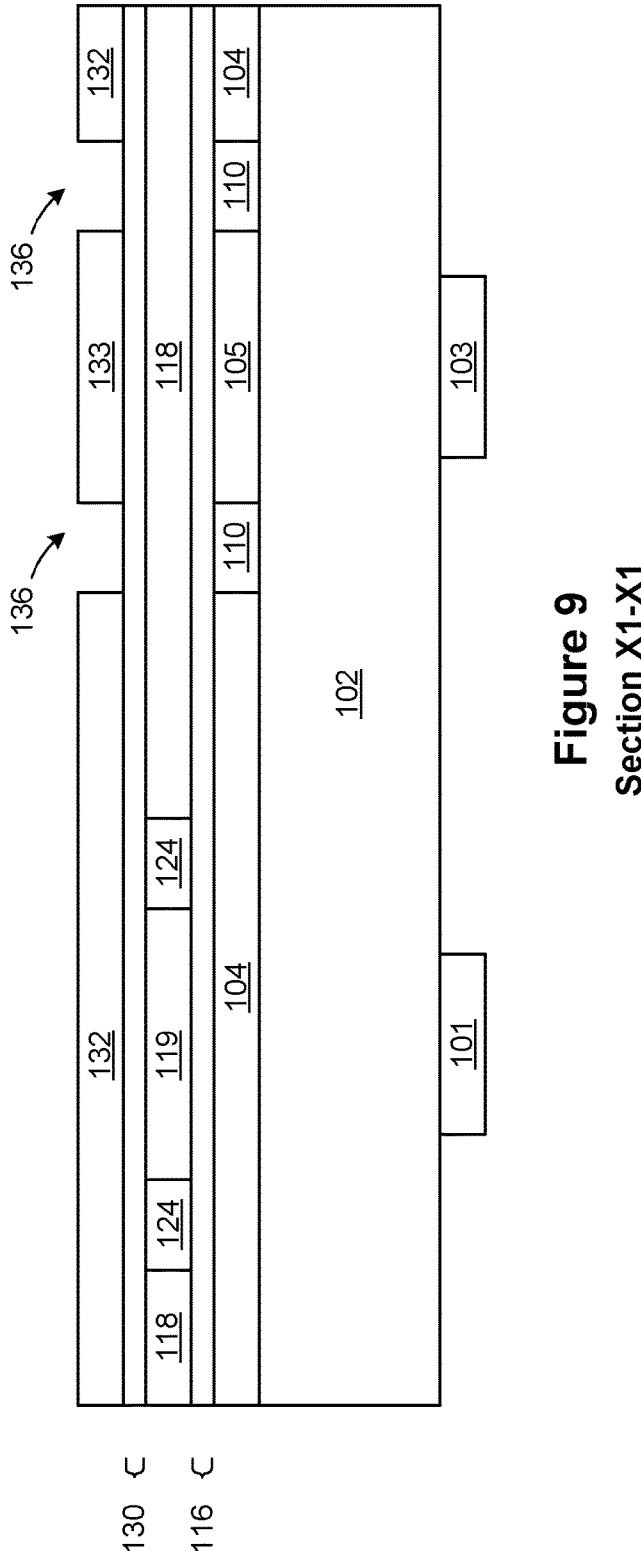
FIG. 9 illustrates a cross-sectional view of the semiconductor structure along section line X1-X1 and illustrates formation of an insulator and formation of a second plate, according to an exemplary embodiment.

Referring now to FIG. 9, the structure 100 is shown according to an exemplary embodiment. FIG. 9 is a cross-sectional view of the structure 100 along section line X1-X1. An insulator 130 may be formed. A top plate 132 and an isolated portion 133 may be formed.

The insulator 130 may be deposited on an upper surface of isolation dielectric 124, the isolated portion 119 and the middle plate 118. The insulator 130 may be deposited using typical deposition techniques, for example, atomic layer deposition (ALD), molecular layer deposition (MLD), chemical vapor deposition (CVD), physical vapor deposition (PVD), high density plasma (HDP) deposition. In an embodiment, the insulator 130 may include any high-k dielectric and may include, but is not limited to $HfO_2$, $ZrO_2$, $La_2O_5$, $Al_2O_3$, $TiO_2$, a high-k dielectric material (with k>4.0), or a combination thereof.

The top plate 132 may be formed from a conductive material layer which is blanket deposited on top of the structure 100, and directly on an upper horizontal surface of the insulator 130. The conductive material layer may include materials such as, for example titanium nitride (TiN), tantalum nitride (TaN). The conductive material can be formed by for example, chemical vapor deposition (CVD), physical vapor deposition (PVD), and atomic layer deposition (ALD) or a combination thereof.

An opening 136 may be formed by removal of portions of the top plate 132, exposing an upper horizontal surface of the insulator 130, by selective etching, such as reactive etching (RIE). In an embodiment, the opening 136 may have a rectangular shaped outline when viewed from a top view of the structure 100. There may be a rectangular shaped isolated portion 133 portion of the top plate 132 within the rectangular shaped outline of the opening 136. In an alternate embodiment, the opening 136 may have circular outline, an oval outline or a polygonal outline, with a portion of the top plate 132 within each outline. The opening 136 may be vertically aligned above the isolation dielectric 110 and vertically aligned above the Mx-1 metal line 103.

Figure 10:
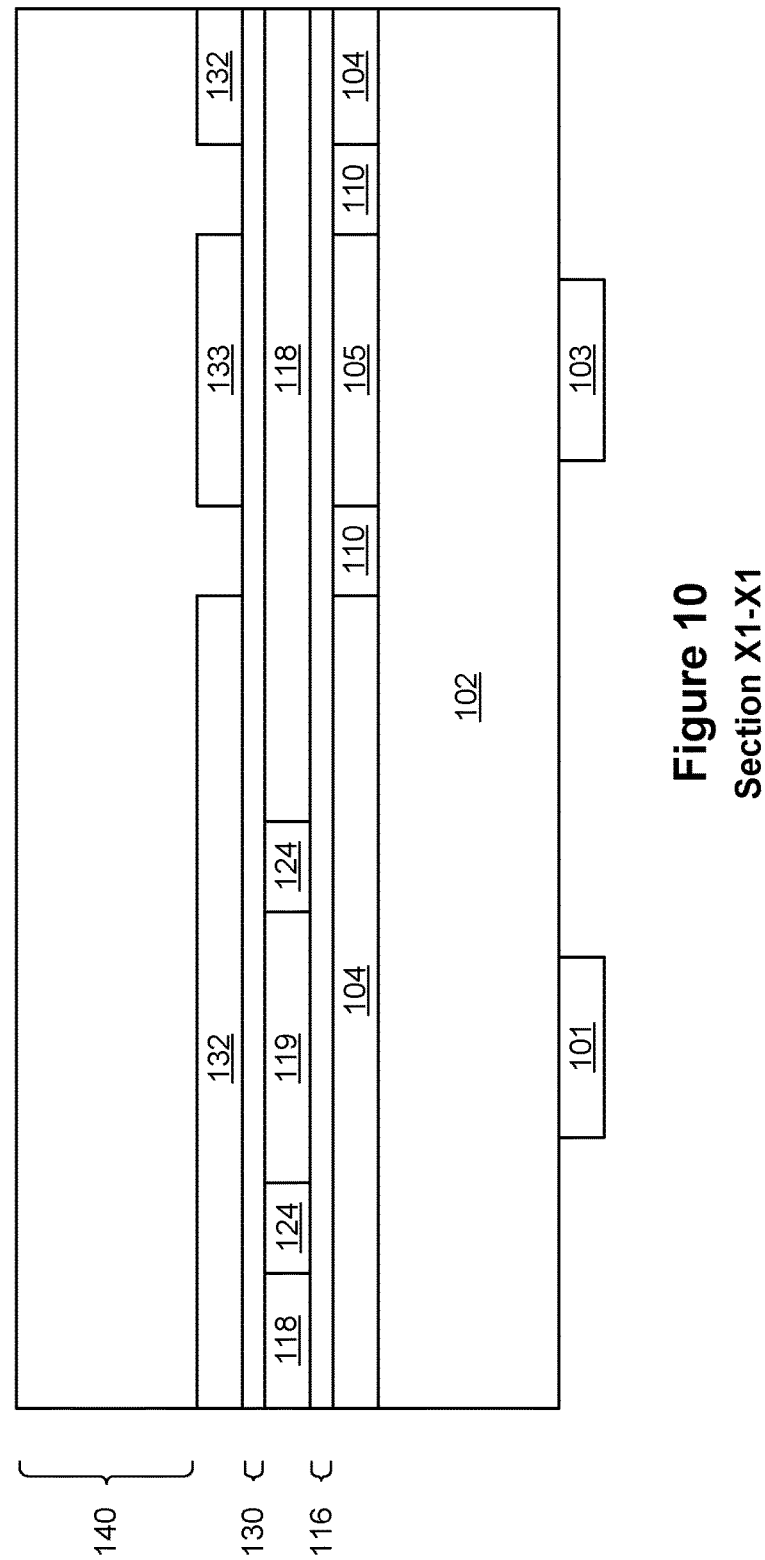
FIG. 10 illustrates a cross-sectional view of the semiconductor structure along section line X1-X1, and illustrations formation of a third inter-layer dielectric, according to an exemplary embodiment.

Referring now to FIG. 10, the structure 100 is shown according to an exemplary embodiment. FIG. 10 is a cross-sectional view of the structure 100 along section line X1-X1. An inter-layer dielectric (hereinafter "ILD") 140 may be formed.

The ILD 140 may be conformally deposited on the structure 100. The ILD 140 may be formed as described for the ILD 102. The ILD 140 may be formed on the top plate 132, the isolated portion 133 and on the insulator 130, and fill the opening 136. The ILD 140 isolates the isolated portion 133 from the top plate 132.

A planarization process, such as, for example, chemical mechanical polishing (CMP), may be done to remove excess material from an upper horizontal surface of the structure 100 such that an upper horizontal surfaces of the ILD 140 is planar.

Figure 11:
FIG. 11 illustrates a top view of the semiconductor structure, and illustrations formation of a via, according to an exemplary embodiment.
Figure 12:
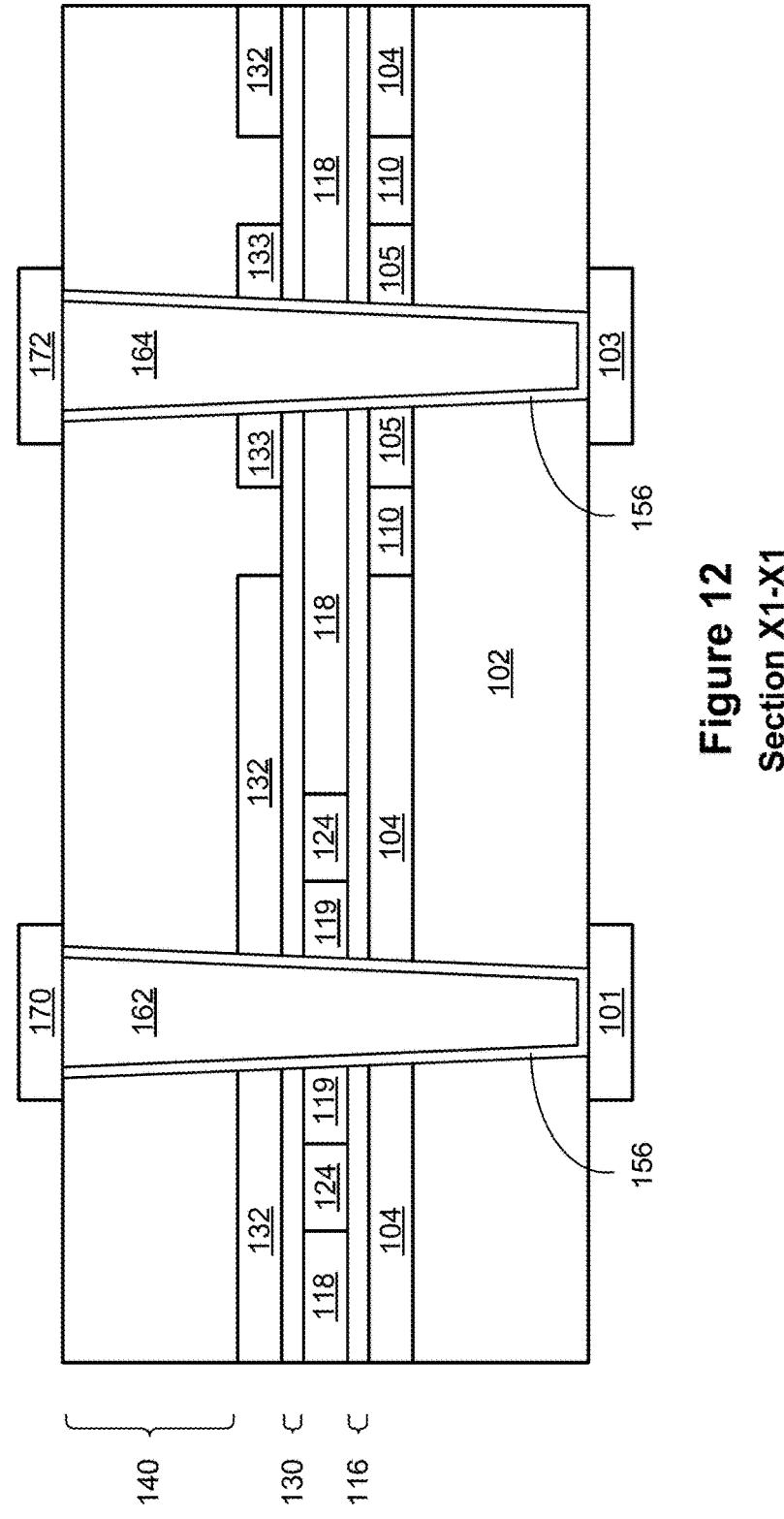
FIG. 12 illustrates a cross-sectional view of the semiconductor structure according to FIG. 11, along section line X1-X1, according to an exemplary embodiment.

Referring now to FIGS. 11 and 12, the semiconductor structure 100 (hereinafter "structure") is shown according to an exemplary embodiment. FIG. 11 is a top view of the structure 100. FIG. 12 is a cross-sectional view of the structure 100 along section line X1-X1. A liner 156, a via 162, a via 164, an Mx metal line 170 and an Mx metal line 172 may be formed.

The dashed lines of the via 162 and the via 164 indicate these structures are below an upper surface of the top view of the structure 100 shown in FIG. 11.

A planarization process, such as, for example, chemical mechanical polishing (CMP), may be done to remove excess material from an upper horizontal surface of the structure 100 such that an upper horizontal surfaces of the ILD 138 is planar.

A first opening (not shown) may be formed in the structure 100. The first opening (not shown) may be formed by removal of vertically aligned portions of the ILD 140, the top plate 132, the insulator 130, the middle plate 118, the isolation dielectric 110, the bottom plate 104, and the ILD 102, exposing an upper horizontal surface of the Mx-1 metal line 101.

A second opening (not shown) may be formed in the structure 100. The second opening (not shown) may be formed by removal of vertically aligned portions of the ILD 140, the insulator 130, the middle plate 118, the insulator 116, the bottom plate 104 and the ILD 102, exposing an upper horizontal surface of the Mx-1 metal line 103.

The liner 156 may be formed in the first opening (not shown) and in the second opening (not shown). The liner 156 may be formed along vertical side surfaces and lower horizontal surfaces of the first, second openings, on vertical side surfaces of the ILD 140, the top plate 132, the insulator 130, the middle plate 118, the insulator 116, the bottom plate 104 and the ILD 102. The liner 156 may be formed on horizontal upper surfaces of the Mx-1 metal line 101 and the Mx-1 metal line 103. The liner 156 may be composed of, for example, tantalum nitride (TaN), tantalum (Ta), titanium (Ti), titanium nitride (TiN), cobalt (Co) or a combination thereof. The liner 156 may be deposited by a conventional deposition process such as, for example, CVD, plasma enhanced chemical vapor deposition (PECVD), PVD or ALD. The liner 156 may be 5 nm thick, although a thickness less than or greater than 5 nm may be acceptable.

In an embodiment, the via 162 and the via 164 are formed from a conductive material layer which is blanket deposited on top of the structure 100, and directly on an upper horizontal surface of the ILD 140, and directly on a top surface of the liner 156, filling the first opening (not shown) and the second opening (not shown). The conductive material layer may include materials such as, for example, copper (Cu), ruthenium (Ru), cobalt (Co), aluminum (Al), tungsten (W), tantalum nitride (TaN) and titanium nitride (TiN). The conductive material can be formed by for example, electrochemical plating, chemical vapor deposition (CVD), physical vapor deposition (PVD), and atomic layer deposition (ALD) or a combination thereof. The via 162 and the via 164 are formed by damascene, or patterned from the conductive material layer, using known patterning and etching techniques. There may be any number of openings in the structure 100, each filled with the liner 156 and the via 162 and the via 164.

A planarization process, such as, for example, chemical mechanical polishing (CMP), may be done to remove excess material from an upper horizontal surface of the structure 100 such that upper horizontal surfaces of the via 162 and the via 164, the liner 156 and the ILD 140 are coplanar.

The Mx metal line 170 and the Mx metal line 172 may be formed as described for the Mx-1 metal line 101 and the Mx-1 metal line 103. There may be any number of Mx metal lines 170 and Mx metal lines 172 on the structure 100.

The top plate 132 and the bottom plate 104 form the outer plate of the MIM capacitor. The insulator 116 and the insulator 130 together form the insulator of the MIM capacitor. The middle plate 118 is part of the MIM capacitor. The outer plate, the insulator and the middle plate 118 form the MIM capacitor. The via 162 is a contact to the outer plate of the MIM capacitor. The via 162 is connected to the Mx-1 metal line 101 and to the Mx metal line 170. The via 164 is a contact to the middle plate 118 of the MIM capacitor. The via 164 is connected to the Mx-1 metal line 103 and to the Mx metal line 172.

The MIM capacitor layers of the outer plate, the insulator and the middle plate 118 each have a planar upper horizontal surface and a planar lower horizontal surface. There are no steps and different heights of the upper horizontal surface nor steps or different heights of the lower horizontal surface. Heights may be measured from an upper horizontal surface of a substrate which the structure 100 is formed on.

The via 162 is connected to a portion of the middle plate 118. The portion of the middle plate 118 which is connected to the via 162 is physically and electrically isolated from the middle plate 118 of the MIM capacitor which is connected to the via 164. The portion of the middle plate 118 surrounding the via 162 is isolated by the isolation dielectric 124 on vertical side surfaces, the insulator 130 on an upper horizontal surface and the insulator 116 on a lower horizontal surface.

The via 164 is connected to isolated portion 105 and isolated portion 133. The isolated portion 105 and the isolated portion 133 which is connected to the via 164 is physically and electrically isolated from the outer plate of the MIM capacitor which is connected to the via 162. The isolated portion 105 is isolated by the isolation dielectric 110 on vertical side surfaces, the insulator 116 on an upper horizontal surface and the ILD 102 on a lower horizontal surface. The isolated portion 133 is isolated by the ILD 140 on vertical side surfaces and on an upper horizontal surface, and the insulator 130 on a lower horizontal surface.

The isolation dielectric 110 and the isolation dielectric 124 have an outline of a rectangular shape when viewed from above. In other embodiments, the isolation dielectric 110 and the isolation dielectric 124 may have an outline of a different shape, such as a circle or other polygon shape.

The structure 100 provides a MIM capacitor with improved reliability due to metal layers (the bottom plate 104, the top plate 132, the middle plate 118) each having one co-planar upper horizontal surface and one co-planar lower horizontal surface, and insulators (insulator 116, 130) with one continuous planar upper horizontal surface and one continuous coplanar lower horizontal surface.

Figure 13:
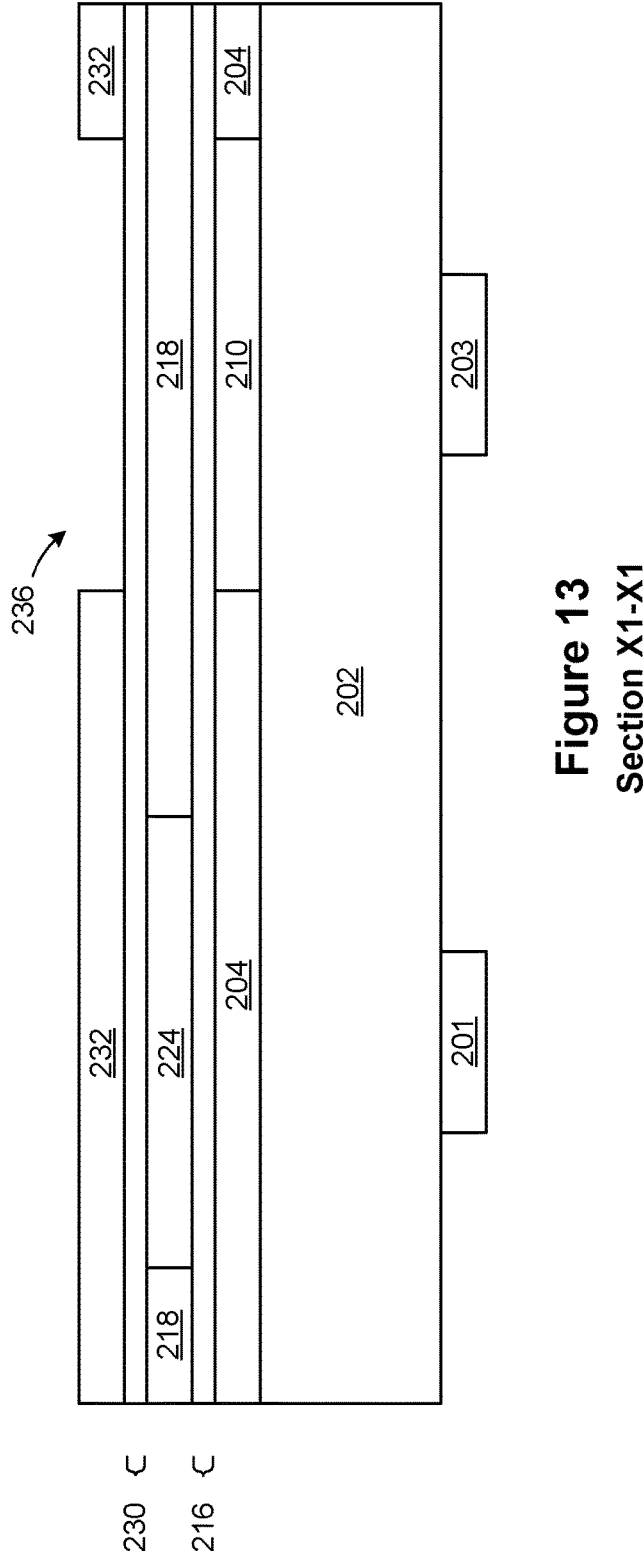
FIGS. 13 and 14 each illustrate a cross-sectional view of a semiconductor structure along section line X1-X1, according to another exemplary embodiment.

Referring now to FIG. 13, a semiconductor structure 200 (hereinafter "structure") at an intermediate stage of fabrication is shown according to an exemplary embodiment. FIG. 13 is a cross-sectional view of the structure 200 along section line X1-X1. The structure 200 may be formed or provided. The structure 200 may include an Mx-1 metal line 201, an Mx-1 metal line 203, an inter-layer dielectric (hereinafter "ILD") 202, a bottom plate 204, an isolation dielectric 210, an insulator 216, a middle plate 218, an isolation dielectric 224, an insulator 230 and a second plate 232.

The elements of the structure 200 may be formed as described for similarly named elements of the structure 100. At this point of fabrication, the structure 200 is the same as the structure 100 of FIG. 9, except for following. The isolation dielectric 210 is completely filled in, rather than an outline of a shape. There is no isolated portion 105. The isolation dielectric 224 is completely filled in, rather than an outline of a shape. There is no isolated portion 119. The opening 236 is completely filled in, rather than an outline of a shape.

Figure 14:
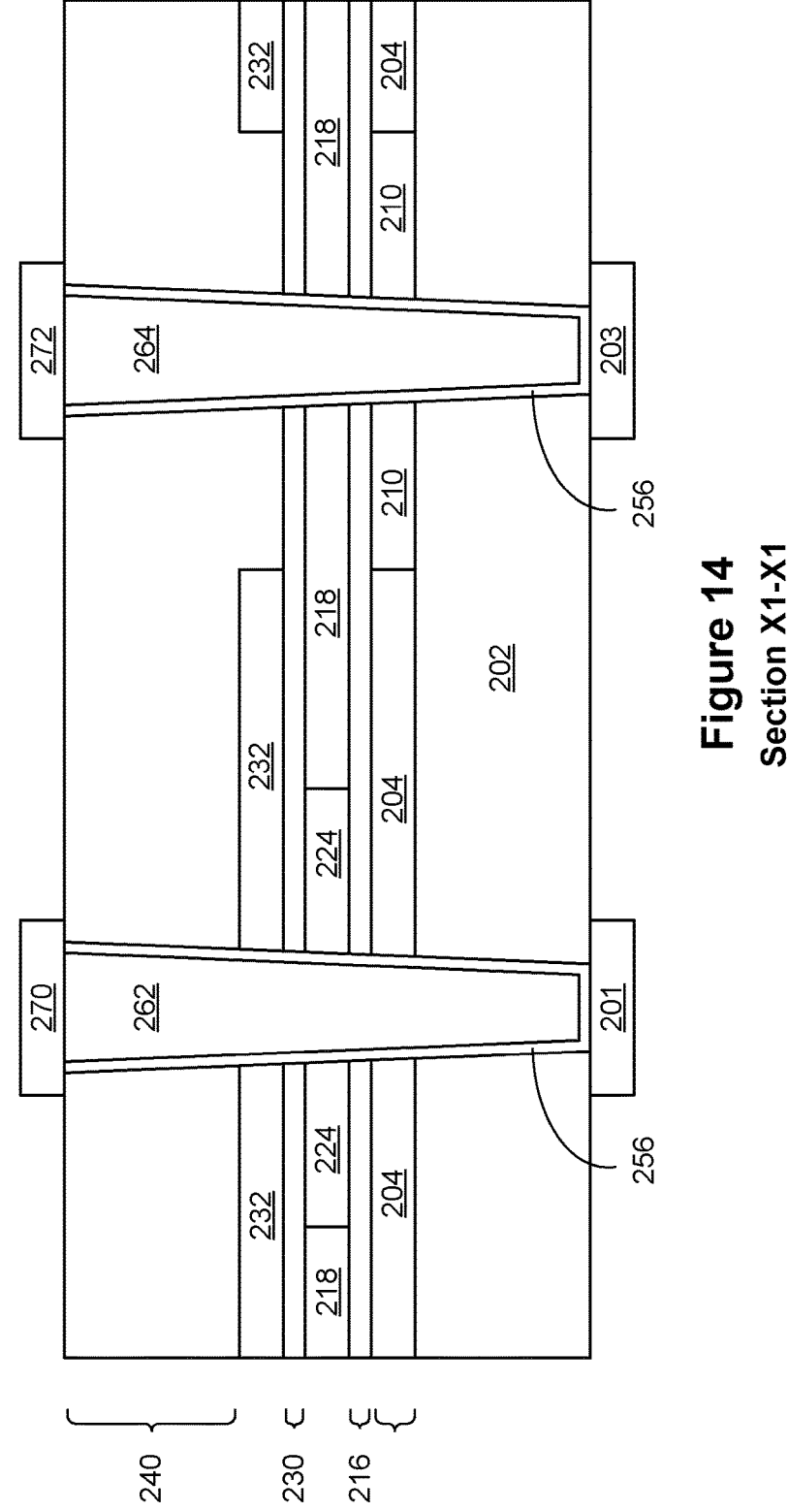

Referring now to FIG. 14, the structure 200 is shown according to an exemplary embodiment. FIG. 14 is a cross-sectional view of the structure 200 along section line X1-X1. An inter-layer dielectric (hereinafter "ILD") 240, a liner 256, a via 262, a via 264, an Mx metal line 270 and an Mx metal line 272 may be formed.

The elements of the structure 200 may be formed as described for similarly named elements of the structure 100.

The second plate 232 and the bottom plate 204 form the outer plate of the MIM capacitor. The insulator 216 and the insulator 230 together form the insulator of the MIM capacitor. The middle plate 218 is part of the MIM capacitor. The outer plate, the insulator and the middle plate 218 form the MIM capacitor. The via 262 is a contact to the outer plate of the MIM capacitor. The via 262 is a contact to the Mx-1 metal line 201 and to the Mx metal line 270. The via 264 is a contact to the middle plate 218 of the MIM capacitor. The via 264 is connected to the Mx-1 metal line 203 and to the Mx metal line 272.

The MIM capacitor layers of the outer plate, the insulator and the middle plate 218 each have a planar upper horizontal surface and a planar lower horizontal surface. There are no steps and different heights of the upper horizontal surface nor steps or different heights of the lower horizontal surface. Heights may be measured from an upper horizontal surface of a substrate which the structure 200 is formed on.

The via 262 is connected to the bottom plate 204 and to the top plate 232 and forms the outer plate. The via 264 is connected to the middle plate 218 and forms the inner plate.

The isolation dielectric 210, the isolation dielectric 224 and the ILD 240 which is co-planar with the second plate 232 each have a rectangular shape when viewed from above. In other embodiments, the isolation dielectric 210, the isolation dielectric 224 and the ILD 240 may have an outline of a different shape, such as a circle or other polygon shape.

The structure 200 provides a MIM capacitor with improved reliability due to metal layers (the bottom plate 204, the second plate 232, the middle plate 218) each having one co-planar upper horizontal surface and one co-planar lower horizontal surface, and insulators (insulator 216, 230) with one continuous planar upper horizontal surface and one continuous coplanar lower horizontal surface.

Figure 15:
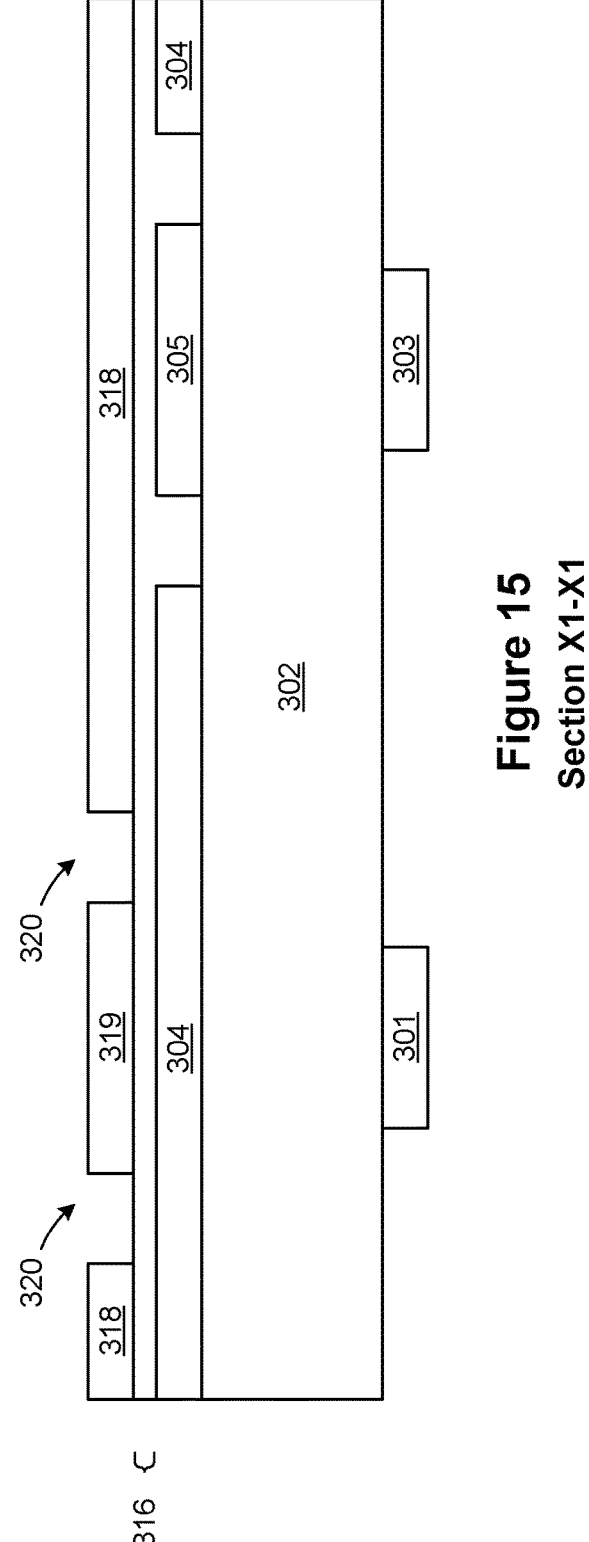
FIGS. 15 and 16 each illustrate a cross-sectional view of a semiconductor structure along section line X1-X1, according to another exemplary embodiment.

Referring now to FIG. 15, a semiconductor structure 300 (hereinafter "structure") at an intermediate stage of fabrication is shown according to an exemplary embodiment. FIG. 15 is a cross-sectional view of the structure 300 along section line X1-X1. The structure 300 may be formed or provided. The structure 300 may include an Mx-1 metal line 301, an Mx-1 metal line 303, inter-layer dielectric (hereinafter "ILD") 302, isolated portion 305, a bottom plate 304, an insulator 316, isolated portion 319, and a middle plate 318.

The elements of the structure 300 may be formed as described for similarly named elements of the structure 100. In comparison of the structure 100 and the structure 300, the insulator 316 of the structure 300 is also present in an area where the isolation dielectric 110 is in the structure 100. This has an advantage of using the same material and less processing steps of separately forming the isolation dielectric 110 and the insulator 116.

The middle plate 318 has an opening 320, similar to the middle plate 118 and the opening 120 of the structure 100 in FIG. 6.

Figure 16:
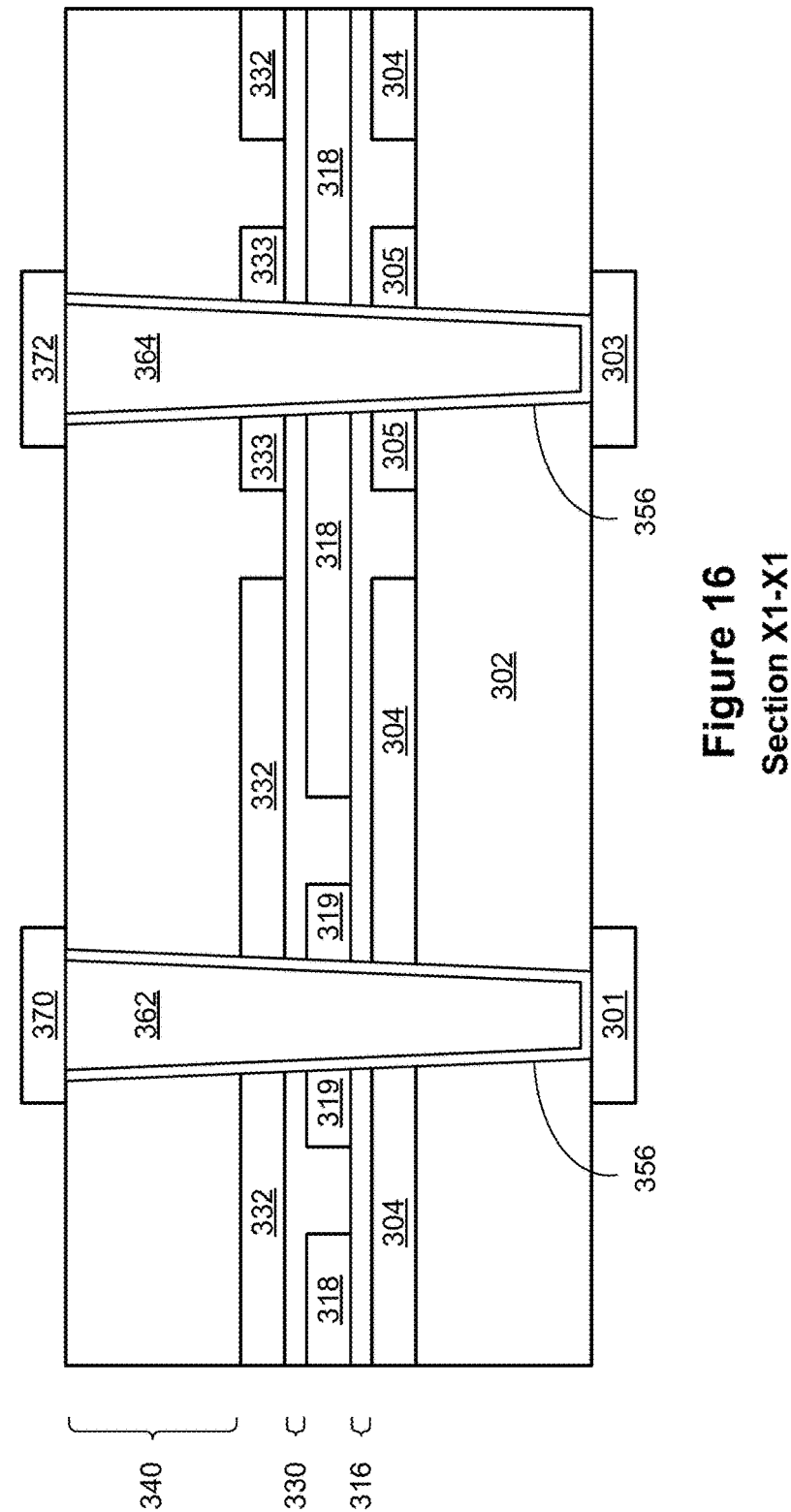

Referring now to FIG. 16, the structure 300 at an intermediate stage of fabrication is shown according to an exemplary embodiment. FIG. 16 is a cross-sectional view of the structure 300 along section line X1-X1. An insulator 330, a second plate 332, isolated portion 333, an inter-layer dielectric (hereinafter "ILD") 340, a liner 356, a via 362, a via 364, an Mx metal line 370 and an Mx metal line 372 may be formed.

In comparison of the structure 100 and the structure 300, the insulator 330 of the structure 300 is also present in an area where the isolation dielectric 124 is in the structure 100. This has an advantage of using the same material and less processing steps of separately forming the isolation dielectric 124 and the insulator 130.

The second plate 332 and the bottom plate 304 form the outer plate of the MIM capacitor. The insulator 316 and the insulator 330 together form the insulator of the MIM capacitor. The middle plate 318 is part of the MIM capacitor. The outer plate, the insulator and the middle plate 318 form the MIM capacitor. The via 362 is a contact to the outer plate of the MIM capacitor. The via 362 is a contact to the Mx-1 metal line 301 and to the Mx metal line 370. The via 364 is a contact to the middle plate 318 of the MIM capacitor. The via 364 is connected to the Mx-1 metal line 303 and to the Mx metal line 372.

The MIM capacitor layers of the outer plate, the insulator and the middle plate 318 each have a planar upper horizontal surface and a planar lower horizontal surface. There are no steps and different heights of the upper horizontal surface nor steps or different heights of the lower horizontal surface. Heights may be measured from an upper horizontal surface of a substrate which the structure 300 is formed on.

The via 362 is connected to a portion of the second plate 332 and the bottom plate 304. The portion of the second plate 332 and the bottom plate 304 which is connected to the via 362 is physically and electrically isolated from isolated portion 305 and isolated portion 333 which is connected to the via 364. The portion of the second plate 332 surrounding the via 362 is isolated by the ILD 340 on vertical side surfaces and an upper horizontal surface, and the insulator 330 on a lower horizontal surface. The portion of the bottom plate 304 surrounding the via 362 is isolated by the insulator 316 on vertical side surfaces and an upper horizontal surface and the ILD 302 on a lower horizontal surface.

The via 364 is connected to a portion of the middle plate 318. The portion of the middle plate 318 which is connected to the via 364 is physically and electrically isolated from the outer plate of the MIM capacitor which is connected to the via 362. The portion of the middle plate 318 is isolated by the insulator 330 on vertical side surfaces and an upper horizontal surface, and the insulator 316 on a lower horizontal surface.

In comparison of the structure 100 and the structure 300, the insulator 316 is in place of the isolation dielectric 110 and the insulator 330 is in place of the isolation dielectric 124. This has an advantage of using the same material and less processing steps of separately forming the isolation dielectric 110 and the isolation dielectric 124.

An isolated area of the bottom plate 304 and the second plate 332 which surround the via 362 may each have an outline of a rectangular shape when viewed from above. An isolated area of the middle plate 318 which surrounds the via 364 may have an outline of a rectangular shape when viewed from above. In other embodiments, isolated regions, may have an outline of a different shape, such as an outline of a circle or other polygon shape.

The structure 300 provides a MIM capacitor with improved reliability due to metal layers (the bottom plate 304, the second plate 332, the middle plate 318) each having one co-planar upper horizontal surface and one co-planar lower horizontal surface, and insulators (insulator 316, 330) with one continuous planar upper horizontal surface.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a metal insulator metal capacitor (MIM capacitor) within back end of line circuitry of the semiconductor device;
   a first via connected to and through a bottom plate of the MIM;
   an outer plate of the MIM, wherein an outer electrode of the MIM comprises the bottom plate and a top plate, wherein an entirety of each of an upper horizontal surface of the bottom plate and an upper horizontal surface of the top plate lies in a single plane and an entirety of each of a lower horizontal surface of the bottom plate and a lower horizontal surface of the top plate lies in a single plane; and
   a middle plate of the MIM, wherein an inner electrode of the MIM comprises the middle plate, wherein an entirety of each of an upper horizontal surface and a lower horizontal surface of the middle plate lies in a single plane, wherein
   a middle isolated portion of the middle plate of the MIM surrounds the first via.

2. The semiconductor device according to claim 1, wherein
   the middle isolated portion is surrounded by a middle isolation dielectric on all vertical side surfaces.

3. The semiconductor device according to claim 2, wherein
   the middle isolation dielectric comprises an outline of a rectangular shape from a top view.

4. The semiconductor device according to claim 1, wherein
   the bottom plate is horizontally below the middle plate, and
   the top plate is horizontally above the middle plate.

5. The semiconductor device according to claim 4, further comprising:
   a second via connected to and through the middle plate of the MIM, wherein
   a bottom isolated portion of the bottom plate surrounds the second via, wherein
   the bottom isolated portion is surrounded by a bottom isolation dielectric on all vertical side surfaces.

6. The semiconductor device according to claim 5, wherein the second via is connected to and through the middle plate, and is connected to and through the bottom isolated portion.

7. The semiconductor device according to claim 6, wherein the second via is connected to and through a top isolated portion of the top plate.

8. The semiconductor device according to claim 6, wherein the bottom plate comprises a single planar upper horizontal surface and a single planar lower horizontal surface;

the middle plate comprises a single planar upper horizontal surface and a single planar lower horizontal surface.

9. A semiconductor device comprising:

a metal insulator metal capacitor (MIM capacitor) within back end of line circuitry of the semiconductor device;

a first via connected to and through a bottom plate of the MIM;

an outer plate of the MIM, wherein an outer electrode of the MIM comprises the bottom plate and a top plate, wherein the bottom plate is comprised of titanium nitride (TiN), wherein an entirety of each of an upper horizontal surface of the bottom plate and an upper horizontal surface of the top plate lies in a single plane and an entirety of each of a lower horizontal surface of the bottom plate and a lower horizontal surface of the top plate lies in a single plane; and a middle plate of the MIM, wherein an inner electrode of the MIM comprises the middle plate, wherein an entirety of each of an upper horizontal surface and a lower horizontal surface of the middle plate lies in a single plane, wherein a middle isolated portion of the middle plate of the MIM surrounds the first via, wherein the middle isolated portion is surrounded by a middle isolation dielectric on all vertical side surfaces.

10. The semiconductor device according to claim 9, wherein the middle isolation dielectric comprises an outline of a rectangular shape from a top view.

11. The semiconductor device according to claim 10, wherein the bottom plate is horizontally below the middle plate, and the top plate is horizontally above the middle plate.

12. The semiconductor device according to claim 11, further comprising:

a second via connected to and through the middle plate of the MIM, wherein a bottom isolated portion of the bottom plate surrounds the second via, wherein the bottom isolated portion is surrounded by a bottom isolation dielectric on all vertical sides.

13. The semiconductor device according to claim 12, wherein the first via is connected to and through the middle plate, and is connected to and through the middle isolated portion.

14. The semiconductor device according to claim 13, further comprising:

the second via is connected to and through the bottom isolated portion, and is connected to and through a top isolated portion of the top plate.

15. The semiconductor device according to claim 14, wherein the bottom plate comprises a single planar upper horizontal surface and a single planar lower horizontal surface;

the middle plate comprises a single planar upper horizontal surface and a single planar lower horizontal surface.

16. A method of forming a semiconductor device comprising:

forming a metal insulator metal capacitor (MIM capacitor) within back end of line circuitry of the semiconductor device;

forming a first via connected to and through a bottom plate of the MIM;

forming an outer plate of the MIM, wherein an outer electrode of the MIM comprises the bottom plate and a top plate, wherein an entirety of each of an upper horizontal surface of the bottom plate and an upper horizontal surface of the top plate lies in a single plane and an entirety of each of a lower horizontal surface of the bottom plate and a lower horizontal surface of the top plate lies in a single plane; and forming a middle plate of the MIM, wherein an inner electrode of the MIM comprises the middle plate, wherein an entirety of each of an upper horizontal surface and a lower horizontal surface of the middle plate lies in a single plane, wherein a middle isolated portion of the middle plate of the MIM surrounds the first via.

17. The method according to claim 16, wherein the middle isolated portion is surrounded by a middle isolation dielectric on all vertical side surfaces.

18. The method according to claim 17, wherein the middle isolation dielectric comprises an outline of a rectangular shape from a top view.

19. The method according to claim 18, wherein the bottom plate is horizontally below the middle plate, and the top plate is horizontally above the middle plate.

20. The method according to claim 19, further comprising:

forming a second via connected to and through the middle plate of the MIM, wherein a bottom isolated portion of the bottom plate surrounds the second via, wherein the bottom isolated portion is surrounded by a bottom isolation dielectric on all vertical sides, wherein the bottom plate comprises a single planar upper horizontal surface and a single planar lower horizontal surface;

the middle plate comprises a single planar upper horizontal surface and a single planar lower horizontal surface.

* * * * *